(12) United States Patent
Potter

(10) Patent No.: US 8,581,308 B2
(45) Date of Patent: Nov. 12, 2013

(54) HIGH TEMPERATURE EMBEDDED CHARGE DEVICES AND METHODS THEREOF

(75) Inventor: Michael D. Potter, Churchville, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 11/059,882

(22) Filed: Feb. 17, 2005

(65) Prior Publication Data

US 2005/0205966 A1 Sep. 22, 2005

Related U.S. Application Data

(60) Provisional application No. 60/546,045, filed on Feb. 19, 2004.

(51) Int. Cl.
*H01L 27/148* (2006.01)

(52) U.S. Cl.
USPC ............................. 257/249; 257/245; 438/587

(58) Field of Classification Search
USPC .................. 257/314, 315, E21.336, E29.309, 257/E21.21, E21.679, 249; 438/257, 259, 438/261, 267, 594
See application file for complete search history.

(56) References Cited

U.S. PATENT DOCUMENTS

| | | |
|---|---|---|
| 2,567,373 A | 9/1951 | Giacoletto et al. |
| 2,588,513 A | 3/1952 | Giacoletta |
| 2,978,066 A | 4/1961 | Nodolf |
| 3,118,022 A | 1/1964 | Sessler et al. |
| 3,397,278 A | 8/1968 | Pomerantz |
| 3,405,334 A | 10/1968 | Jewett et al. |
| 3,487,610 A | 1/1970 | Brown et al. |
| 3,715,500 A | 2/1973 | Sessler et al. |
| 3,731,163 A | 5/1973 | Shuskus |
| 3,742,767 A | 7/1973 | Bernard et al. |
| 3,786,495 A | 1/1974 | Spence |
| 3,858,307 A | 1/1975 | Yoshimura et al. |
| 3,924,324 A | 12/1975 | Kodera |
| 4,047,214 A | 9/1977 | Francombe et al. |

(Continued)

FOREIGN PATENT DOCUMENTS

| | | |
|---|---|---|
| JP | 58-029379 A | 2/1983 |
| JP | 62-297534 | 12/1987 |

(Continued)

OTHER PUBLICATIONS

Ma et al. "Fixed and trapped charges at oxide-nitride-oxide heterostructure interfaces formed by remote plasma enhanced chemical vapor deposition," J. Vac. Sci. Technol. B. vol. 11, No. 4, Jul./Aug. 1993, pp. 1533-1540.*

(Continued)

*Primary Examiner* — Ajay K Arora
(74) *Attorney, Agent, or Firm* — Joseph M. Noto; Bond Schoeneck & King, PLLC

(57) ABSTRACT

A device for storing embedded charge includes a first insulator and at least one second insulator. The first insulator has at least two outer surfaces and has a band gap of less than about 5.5 eV. The second insulator is deposited on at least each of the at least two outer surfaces of the first insulator to form at least one interface for storing charge between the first and second insulators. The second insulator has a band gap of more than about 6.0 eV.

9 Claims, 2 Drawing Sheets

Trapped charge at the interface of two dissimilar insulators.

(56) References Cited

U.S. PATENT DOCUMENTS

| | | |
|---|---|---|
| 4,102,202 A | 7/1978 | Ferriss |
| 4,115,914 A | 9/1978 | Harari |
| 4,126,822 A | 11/1978 | Wahlstrom |
| 4,160,882 A | 7/1979 | Driver |
| 4,166,729 A | 9/1979 | Thompson et al. |
| 4,285,714 A | 8/1981 | Kirkpatrick |
| 4,288,735 A | 9/1981 | Crites |
| 4,340,953 A | 7/1982 | Iwamura et al. |
| 4,375,718 A | 3/1983 | Wadsworth et al. |
| 4,490,772 A | 12/1984 | Blickstein |
| 4,504,550 A | 3/1985 | Pook |
| 4,513,049 A | 4/1985 | Yamasaki et al. |
| 4,581,624 A | 4/1986 | O'Connor |
| 4,585,209 A | 4/1986 | Aine et al. |
| 4,626,263 A | 12/1986 | Inoue et al. |
| 4,626,729 A | 12/1986 | Lewiner et al. |
| 4,701,640 A | 10/1987 | Flygstad et al. |
| 4,716,331 A | 12/1987 | Higgins, Jr. |
| 4,736,629 A | 4/1988 | Cole |
| 4,789,504 A | 12/1988 | Ohmori et al. |
| 4,789,803 A | 12/1988 | Jacobsen et al. |
| 4,794,370 A | 12/1988 | Simpson et al. |
| 4,874,659 A | 10/1989 | Ando et al. |
| 4,905,701 A | 3/1990 | Cornelius |
| 4,922,756 A | 5/1990 | Henrion |
| 4,944,854 A | 7/1990 | Felton et al. |
| 4,945,068 A | 7/1990 | Sugaya |
| 4,945,393 A * | 7/1990 | Beltram et al. .......... 365/185.06 |
| 4,958,317 A | 9/1990 | Terada et al. |
| 4,965,244 A * | 10/1990 | Weaver et al. ................ 505/473 |
| 4,996,627 A | 2/1991 | Zias et al. |
| 4,997,521 A | 3/1991 | Howe et al. |
| 5,020,030 A | 5/1991 | Huber |
| 5,050,435 A | 9/1991 | Pinson |
| 5,051,643 A | 9/1991 | Dworsky et al. |
| 5,054,081 A | 10/1991 | West |
| 5,057,710 A | 10/1991 | Nishiura et al. |
| 5,081,513 A | 1/1992 | Jackson et al. |
| 5,082,242 A | 1/1992 | Bonne et al. |
| 5,088,326 A | 2/1992 | Wada et al. |
| 5,092,174 A | 3/1992 | Reidemeister et al. |
| 5,095,752 A | 3/1992 | Suzuki et al. |
| 5,096,388 A | 3/1992 | Weinberg |
| 5,108,470 A | 4/1992 | Pick |
| 5,112,677 A | 5/1992 | Tani et al. |
| 5,118,942 A | 6/1992 | Hamade |
| 5,129,794 A | 7/1992 | Beatty |
| 5,132,934 A | 7/1992 | Quate et al. |
| 5,143,854 A | 9/1992 | Pirrung et al. |
| 5,156,810 A | 10/1992 | Ribi |
| 5,164,319 A | 11/1992 | Hafeman et al. |
| 5,180,623 A | 1/1993 | Ohnstein |
| 5,189,641 A | 2/1993 | Arakawa |
| 5,207,103 A | 5/1993 | Wise et al. |
| 5,228,373 A | 7/1993 | Welsch |
| 5,231,045 A | 7/1993 | Miura et al. |
| 5,238,223 A | 8/1993 | Mettner et al. |
| 5,256,176 A | 10/1993 | Matsuura et al. |
| 5,262,000 A | 11/1993 | Welbourn et al. |
| 5,284,179 A | 2/1994 | Shikida et al. |
| 5,284,692 A | 2/1994 | Bell |
| 5,323,999 A | 6/1994 | Bonne et al. |
| 5,334,238 A | 8/1994 | Goodson et al. |
| 5,336,062 A | 8/1994 | Richter |
| 5,336,904 A * | 8/1994 | Kusunoki ...................... 257/23 |
| 5,348,571 A | 9/1994 | Weber |
| 5,349,492 A | 9/1994 | Kimura et al. |
| 5,355,577 A | 10/1994 | Cohn |
| 5,365,790 A | 11/1994 | Chen et al. |
| 5,367,429 A | 11/1994 | Tsuchitani et al. |
| 5,380,396 A | 1/1995 | Shikida et al. |
| 5,392,650 A | 2/1995 | O'Brien et al. |
| 5,417,235 A | 5/1995 | Wise et al. |
| 5,417,312 A | 5/1995 | Tsuchitani et al. |
| 5,419,953 A | 5/1995 | Chapman |
| 5,434,109 A * | 7/1995 | Geissler et al. ................ 438/702 |
| 5,441,597 A | 8/1995 | Bonne et al. |
| 5,445,008 A | 8/1995 | Wachter et al. |
| 5,474,599 A | 12/1995 | Cheney et al. |
| 5,488,864 A | 2/1996 | Stephan |
| 5,491,604 A | 2/1996 | Nguyen et al. |
| 5,496,507 A | 3/1996 | Angadjivand et al. |
| 5,512,882 A | 4/1996 | Stetter et al. |
| 5,519,240 A | 5/1996 | Suzuki |
| 5,520,522 A | 5/1996 | Rathore et al. |
| 5,526,172 A | 6/1996 | Kanack |
| 5,567,336 A | 10/1996 | Tatah |
| 5,578,976 A | 11/1996 | Yao |
| 5,591,679 A | 1/1997 | Jakobsen et al. |
| 5,593,476 A | 1/1997 | Coppom |
| 5,593,479 A | 1/1997 | Frey et al. |
| 5,596,194 A | 1/1997 | Kubena et al. |
| 5,616,844 A | 4/1997 | Suzuki et al. |
| 5,635,739 A | 6/1997 | Grieff et al. |
| 5,640,133 A | 6/1997 | MacDonald et al. |
| 5,668,303 A | 9/1997 | Giesler et al. |
| 5,671,905 A | 9/1997 | Hopkins, Jr. |
| 5,677,617 A | 10/1997 | Tokai et al. |
| 5,698,771 A | 12/1997 | Shields et al. |
| 5,739,834 A | 4/1998 | Okabe et al. |
| 5,747,692 A | 5/1998 | Jacobsen et al. |
| 5,771,148 A | 6/1998 | Davis |
| 5,777,977 A | 7/1998 | Fujiwara et al. |
| 5,788,468 A | 8/1998 | Dewa et al. |
| 5,793,485 A | 8/1998 | Gourley |
| 5,798,146 A | 8/1998 | Murokh et al. |
| 5,807,425 A | 9/1998 | Gibbs |
| 5,812,163 A | 9/1998 | Wong |
| 5,839,062 A | 11/1998 | Nguyen et al. |
| 5,846,302 A | 12/1998 | Putro |
| 5,846,708 A | 12/1998 | Hollis et al. |
| 5,871,567 A | 2/1999 | Covington et al. |
| 5,874,675 A | 2/1999 | Edmans et al. |
| 5,897,097 A | 4/1999 | Biegelsen et al. |
| 5,908,603 A | 6/1999 | Tsai et al. |
| 5,914,553 A | 6/1999 | Adams et al. |
| 5,919,364 A | 7/1999 | Lebouitz et al. |
| 5,920,011 A | 7/1999 | Hulsing, II |
| 5,941,501 A | 8/1999 | Biegelsen et al. |
| 5,955,932 A | 9/1999 | Nguyen et al. |
| 5,959,516 A | 9/1999 | Chang et al. |
| 5,967,163 A | 10/1999 | Pan et al. |
| 5,969,250 A | 10/1999 | Greiff |
| 5,971,355 A | 10/1999 | Biegelsen et al. |
| 5,993,520 A | 11/1999 | Yu |
| 5,994,982 A | 11/1999 | Kintis et al. |
| 6,007,309 A | 12/1999 | Hartley |
| 6,016,092 A | 1/2000 | Qiu et al. |
| 6,018,170 A * | 1/2000 | Hatano et al. ................ 257/249 |
| 6,032,923 A | 3/2000 | Biegelsen et al. |
| 6,033,852 A | 3/2000 | Andle et al. |
| 6,037,797 A | 3/2000 | Lagowski et al. |
| 6,040,611 A | 3/2000 | De Los Santos et al. |
| 6,043,727 A | 3/2000 | Warneke et al. |
| 6,046,659 A | 4/2000 | Loo et al. |
| 6,048,692 A | 4/2000 | Maracas et al. |
| 6,051,853 A | 4/2000 | Shimada et al. |
| 6,057,520 A | 5/2000 | Goodwin-Johansson |
| 6,069,540 A | 5/2000 | Berenz et al. |
| 6,089,534 A | 7/2000 | Biegelsen et al. |
| 6,094,102 A | 7/2000 | Chang et al. |
| 6,100,477 A | 8/2000 | Randall et al. |
| 6,106,245 A | 8/2000 | Cabuz |
| 6,119,691 A | 9/2000 | Angadjivand et al. |
| 6,120,002 A | 9/2000 | Biegelsen et al. |
| 6,123,316 A | 9/2000 | Biegelsen et al. |
| 6,124,632 A | 9/2000 | Lo et al. |
| 6,126,140 A | 10/2000 | Johnson et al. |
| 6,127,744 A | 10/2000 | Streeter et al. |
| 6,127,812 A | 10/2000 | Ghezzo et al. |
| 6,149,190 A | 11/2000 | Galvin et al. |
| 6,168,395 B1 | 1/2001 | Quenzer et al. |
| 6,168,948 B1 | 1/2001 | Anderson et al. |
| 6,170,332 B1 | 1/2001 | MacDonald et al. |

(56) References Cited

U.S. PATENT DOCUMENTS

| | | | |
|---|---|---|---|
| 6,177,351 B1 | 1/2001 | Beratan et al. | |
| 6,181,009 B1 | 1/2001 | Takahashi et al. | |
| 6,197,139 B1 | 3/2001 | Ju et al. | |
| 6,199,874 B1 | 3/2001 | Galvin et al. | |
| 6,204,737 B1 | 3/2001 | Ellä | |
| 6,214,094 B1 | 4/2001 | Rousseau et al. | |
| 6,238,946 B1 | 5/2001 | Ziegler | |
| 6,255,758 B1 | 7/2001 | Cabuz et al. | |
| 6,265,758 B1 | 7/2001 | Takahashi | |
| 6,275,122 B1 | 8/2001 | Speidell et al. | |
| 6,287,776 B1 | 9/2001 | Hefti | |
| 6,324,914 B1 | 12/2001 | Xue et al. | |
| 6,336,353 B2 | 1/2002 | Matsiev et al. | |
| 6,384,353 B1 | 5/2002 | Huang et al. | |
| 6,393,895 B1 | 5/2002 | Matsiev et al. | |
| 6,395,638 B1 | 5/2002 | Linnemann et al. | |
| 6,423,148 B1* | 7/2002 | Aoki | 134/3 |
| 6,431,212 B1 | 8/2002 | Hayenga et al. | |
| 6,469,785 B1 | 10/2002 | Duveneck et al. | |
| 6,470,754 B1 | 10/2002 | Gianchandani | |
| 6,485,273 B1 | 11/2002 | Goodwin-Johansson | |
| 6,496,348 B2 | 12/2002 | McIntosh | |
| 6,504,118 B2 | 1/2003 | Hyman et al. | |
| 6,580,280 B2 | 6/2003 | Nakae et al. | |
| 6,597,560 B2 | 7/2003 | Potter | |
| 6,626,417 B2 | 9/2003 | Winger et al. | |
| 6,638,627 B2 | 10/2003 | Potter | |
| 6,673,677 B2* | 1/2004 | Hofmann et al. | 438/257 |
| 6,674,132 B2* | 1/2004 | Willer | 257/390 |
| 6,688,179 B2 | 2/2004 | Potter et al. | |
| 6,707,355 B1 | 3/2004 | Yee | |
| 6,717,488 B2 | 4/2004 | Potter | |
| 6,734,770 B2 | 5/2004 | Aigner et al. | |
| 6,750,590 B2 | 6/2004 | Potter | |
| 6,773,488 B2 | 8/2004 | Potter | |
| 6,787,438 B1 | 9/2004 | Nelson | |
| 6,798,132 B2* | 9/2004 | Satake | 313/495 |
| 6,841,917 B2 | 1/2005 | Potter | |
| 6,842,009 B2 | 1/2005 | Potter | |
| 6,854,330 B2 | 2/2005 | Potter | |
| 7,195,393 B2 | 3/2007 | Potter | |
| 7,211,923 B2* | 5/2007 | Potter | 310/309 |
| 7,217,582 B2 | 5/2007 | Potter | |
| 7,280,014 B2 | 10/2007 | Potter | |
| 7,287,328 B2 | 10/2007 | Potter | |
| 2001/0047689 A1 | 12/2001 | McIntosh | |
| 2002/0000649 A1 | 1/2002 | Tilmans et al. | |
| 2002/0012937 A1 | 1/2002 | Tender et al. | |
| 2002/0072201 A1 | 6/2002 | Potter | |
| 2002/0131228 A1 | 9/2002 | Potter | |
| 2002/0131230 A1 | 9/2002 | Potter | |
| 2002/0182091 A1 | 12/2002 | Potter | |
| 2002/0185003 A1 | 12/2002 | Potter | |
| 2002/0187618 A1 | 12/2002 | Potter | |
| 2002/0197761 A1 | 12/2002 | Patel et al. | |
| 2003/0079543 A1 | 5/2003 | Potter | |
| 2003/0079548 A1 | 5/2003 | Potter et al. | |
| 2003/0080839 A1 | 5/2003 | Wong | |
| 2003/0081397 A1 | 5/2003 | Potter | |
| 2003/0112096 A1 | 6/2003 | Potter | |
| 2003/0201784 A1 | 10/2003 | Potter | |
| 2003/0210573 A1* | 11/2003 | Lee | 365/185.29 |
| 2004/0023236 A1 | 2/2004 | Potter et al. | |
| 2004/0113752 A1 | 6/2004 | Schuster | |
| 2004/0145271 A1 | 7/2004 | Potter | |
| 2004/0155555 A1 | 8/2004 | Potter | |
| 2005/0035683 A1 | 2/2005 | Raisanen | |
| 2005/0044955 A1 | 3/2005 | Potter | |
| 2005/0079640 A1 | 4/2005 | Potter | |
| 2005/0110057 A1* | 5/2005 | Wang et al. | 257/288 |
| 2005/0186117 A1 | 8/2005 | Uchiyama et al. | |
| 2006/0131692 A1* | 6/2006 | Saitoh et al. | 257/565 |
| 2007/0074731 A1 | 4/2007 | Potter | |
| 2007/0152776 A1 | 7/2007 | Potter | |

FOREIGN PATENT DOCUMENTS

| | | |
|---|---|---|
| JP | 02-219478 A | 9/1990 |
| JP | 4-236172 | 8/1992 |
| JP | 08-308258 A | 11/1996 |
| JP | 2000-304567 A | 11/2000 |
| WO | WO 97/31506 A1 | 8/1997 |

OTHER PUBLICATIONS

"Embedded Electronic Charge MEMS Sensor Technology", Michael D. Potter, Meeting Paper, Nanotech 2002, American Institute of Aeronautics and Astronautics, Sep. 9-12, 2002.*

Wu et al. ("Field related passivation of interface trap after high-field electron injection", Electronics Letters, vol. 34, No. 7, Apr. 2, 1998, pp. 656-657.*

Aguilera et al., "Electron Energy Distribution at the Insulator-Semiconductor Interface in AC Thin Film Electroluminescent Display Devices," *IEEE Transactions on Electron Devices* 41(8):1357-1363 (1994).

Brown, et al., "A Varactor-Tuned RF Filter," *IEEE Trans. on MTT*, pp. 1-4 (1999).

Cass, S., "Large Jobs for Little Devices," *IEEE Spectrum*, pp. 72-73 (2001).

Cui, Z., "Basic Information in Microfluidic System: A Knowledge Base for Microfluidic Devices," retrieved from the internet at http://web.archive.org/web/20011015071501/http://www.ccmicro.rl.ac.uk/info_microfluidics.html (Oct. 15, 2001).

ILIC et al., "Mechanical Resonant Immunospecific Biological Detector," *Appl. Phys. Lett.* 77(3):450-452 (2000).

ILIC et al., "Single Cell Detection with Micromechanical Oscillators," *J. Vac. Sci. Technol. B* 19(6):2825-2828 (2001).

Judy et al., "Surface Machined Micromechanical Membrane Pump," *IEEE*, pp. 182-186 (1991).

Kobayashi et al., "Distribution of Trapped Electrons at Interface State in ACTFEL Devices," in Proceedings of the Sixth International Workshop on Electroluminescence, El Paso, Texas, May 11-13, 1992.

Laser & Santiago, "A Review of Micropumps," *J. Micromech. Microeng.* 14:R35-R64 (2004).

Shoji & Esashi, "Microflow Devices and Systems," *J. Micromech. Microeng.* 4:157-171 (1994).

http://ucsub.colorado.edu/~maz/research/background.html [Retrieved from Web site on Apr. 4, 2001].

"Low-Power, High-Performance MEMS-Based Switch Fabric," at http://www.ece.ncsu.edu/erl/damemi/switchproj.html [Retrieved from Web site on Apr. 4, 2001].

http://wwvv.eecs.umich.edu/RADLAB/bio/rebeiz/Current_Research.html [Retrieved from Web site on Apr. 4, 2001].

"MEMS Technology Developers," at http://www.ida.org/DIVISIONS/std/MEMS/tech_fluids.html [Retrieved from the internet on Jun. 13, 2002].

Tada, Y., "Experimental Characteristics of Electret Generator, Using Polymer Film Electrets," *Jpn. J. Appl. Phys.* 31:846-851, Mar. 1992.

Sterken et al., "An Electret-Based Electrostatic μ-Generator," $12_{th}$ *International Conference on Solid State Sensors, Actuators and Microsytems*, pp. 1291-1294, Boston, MA (Jun. 8-12, 2003).

Peano & Tambosso, "Design and Optimization of MEMS Electret-Based Capacitive Energy Scavenger," *J. Microelectromechanical Systems* 14(3):429-435, Jun. 2005.

Tada, Y.., "Improvement of Conventional Electret Motors," *IEEE Transactions on Electrical Insulation* 28(3): 402-410, Jun. 1993.

Gracewski et al., "Design and Modeling of a Micro-Energy Harvester Using an Embedded Charge Layer," *J. Micromech. Microeng.* 16:235-241, Jan. 2006.

Jefimenko & Walker, "Electrostatic Current Generator Having a Disk Electret as an Active Element," *Transactions on Industry Applications* 1A-14(6):537-540, (Nov./Dec. 1978).

Genda et al., "High Power Electrostatic Motor and Generator Using Electrets," $12^{th}$ *International Conference on Solid State Sensors, Actuators and Microsytems*, pp. 492-495, Boston, MA (Jun. 8-12, 2003).

* cited by examiner

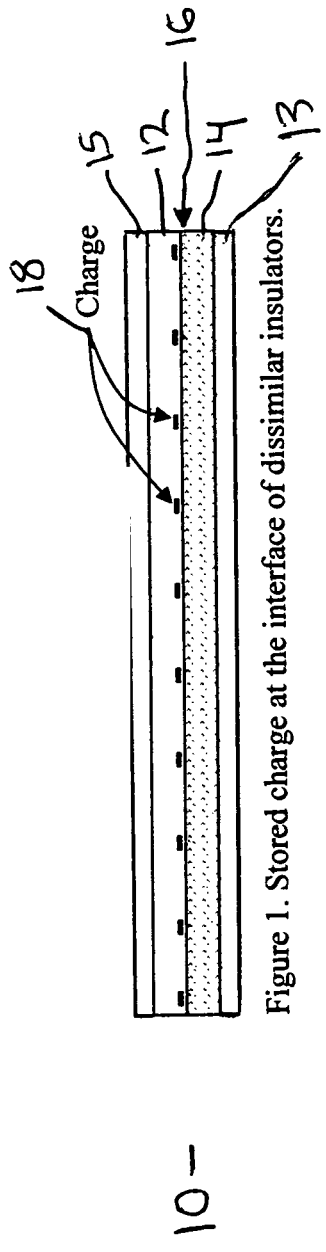
Figure 1. Stored charge at the interface of dissimilar insulators.
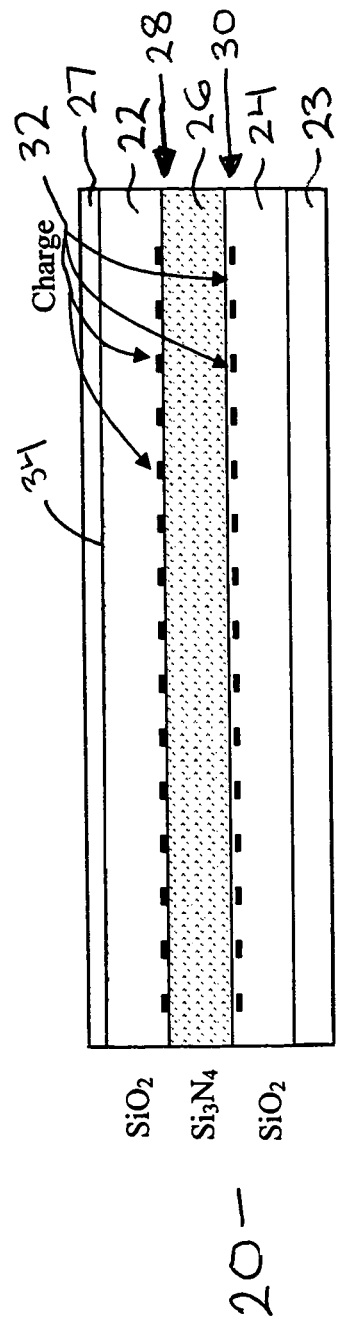
Figure 2. Trapped charge at the interface of two dissimilar insulators.

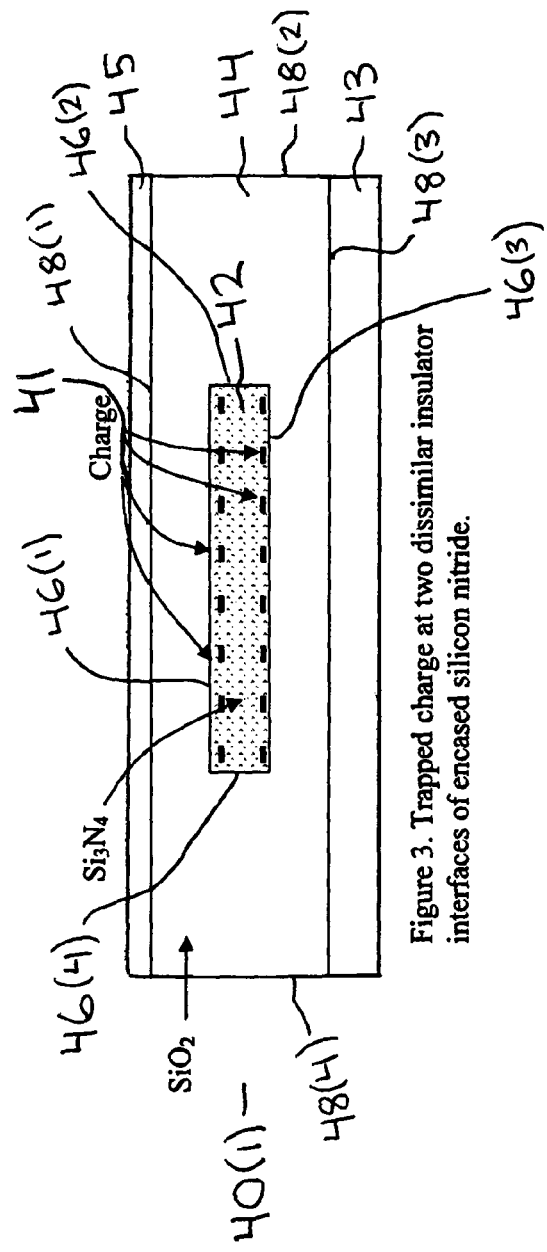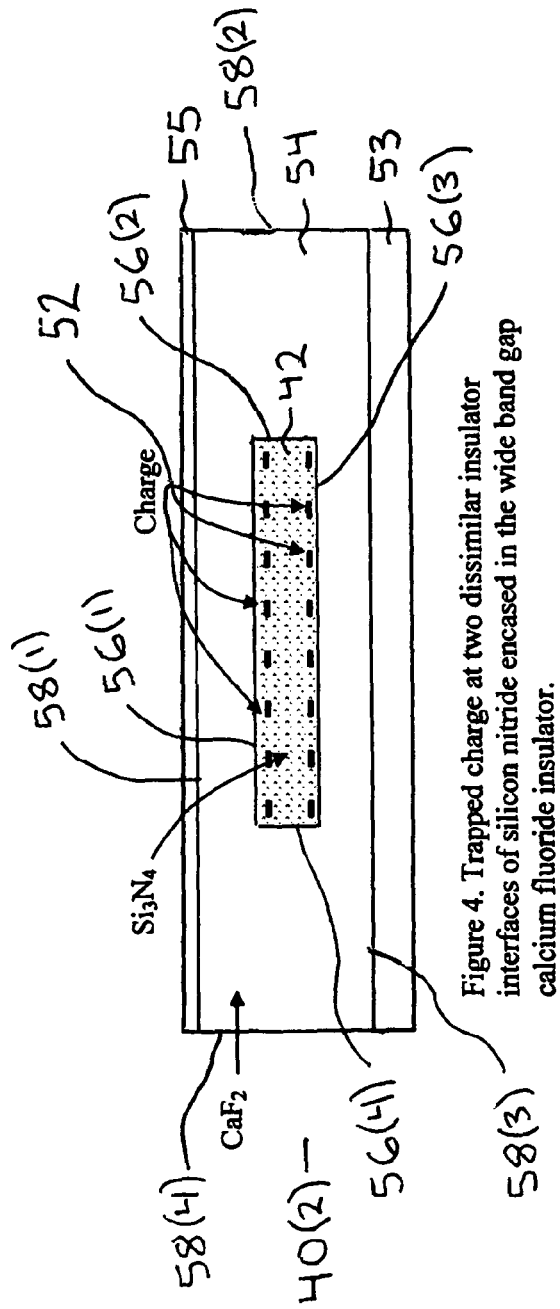
Figure 3. Trapped charge at two dissimilar insulator interfaces of encased silicon nitride.
Figure 4. Trapped charge at two dissimilar insulator interfaces of silicon nitride encased in the wide band gap calcium fluoride insulator.

HIGH TEMPERATURE EMBEDDED CHARGE DEVICES AND METHODS THEREOF

This application claims the benefit of U.S. Provisional Patent Application Ser. No. 60/546,045, filed Feb. 19, 2004, which is hereby incorporated by reference in its entirety.

FIELD OF THE INVENTION

The present invention generally relates to devices for storing charge and, more particularly, to high temperature, embedded charge devices and methods thereof

BACKGROUND

Embedded charge technology is being exploited in numerous ways. The underlying science provides a platform for devices that range from micro sensors to macroscopic energy transducers. Embedded charge technology has excellent long-term reliability in environments where the temperature does not exceed a few hundred degrees Celsius.

Embedded charge technology utilizes electronic charge that is trapped at the interface of dissimilar insulators. Typically, systems employ insulators, such as silicon dioxide ($SiO_2$)—silicon nitride ($Si_3N_4$), as continuous thin films. For applications in harsh environments with elevated temperatures above a few hundred degrees Celsius there is a need for significant improvement in overall temperature robustness.

An example of prior device 10 for storing embedded charge with charge stored at the interface of dissimilar insulators is illustrated in FIG. 1. The device 10 has a layer of silicon dioxide 14 between a substrate 13 and a layer of silicon nitride 12 and a conductor 15 on the layer of silicon nitride 12. Electronic charge is stored at an interface 16 between the layers 12 and 14. The band gap of the layer of silicon nitride 12 is approximately 5 eV, whereas the band gap of the layer of silicon dioxide 14 is about 9 eV. In this device 10, when electronic charge 18 is stored at the interface 16 of the dissimilar insulators 12 and 14 and the surrounding temperature does not exceed a few hundred degrees Celsius and is not placed in a high electric field, the charge loss mechanism is dominated by Frenkle-Poole conduction through the layer of silicon nitride 12. However, when the surrounding temperature exceeds a few hundred degrees Celsius and/or the device 10 is placed in a high electric field, the retention of the embedded charge 18 in this device 10 deteriorates and the charge 18 can escape to the conductor 15.

SUMMARY

A device for storing embedded charge in accordance with embodiments of the present invention includes a first insulator and at least one second insulator. The first insulator has at least two outer surfaces and has a band gap of less than about 5.5 eV. The second insulator is deposited on at least each of the at least two outer surfaces of the first insulator to form at least one interface for storing charge between the first and second insulators. The second insulator has a band gap of more than about 6.0 eV.

A method for making a device for storing embedded charge in accordance with embodiments of the present invention includes providing a first insulator having at least two outer surfaces and depositing at least one second insulator on at least each of the at least two outer surfaces of the first insulator to form at least one interface for storing charge between the first and second insulators. The first insulator has a band gap of less than about 5.5 eV and the second insulator has a band gap of more than about 6.0 eV.

A device for storing embedded charge in accordance with embodiments of the present invention includes a first insulator and at least one second insulator which substantially encases the first insulator to form at least one interface for storing charge. The first insulator has a band gap of less than about 5.5 eV and the second insulator has a band gap of more than about 6.0 eV.

A method for making a device for storing embedded charge in accordance with embodiments of the present invention includes providing a first insulator and substantially encasing the first insulator with at least one second insulator to form at least one interface for storing charge between the first and second insulators. The first insulator having a band gap of less than about 5.5 eV and the second insulator having a band gap of more than about 6.0 eV The present invention provides a system method for making local regions of embedded electronic charge with high temperature reliability. The present invention utilizes very wide band gap insulating materials in conjunction with medium to low band gap insulating materials to significantly improve embedded charge high temperature trapped charge retention time. The present invention also is easily integratable with standard integrated circuits and silicon carbide devices.

BRIEF DESCRIPTION OF THE DRAWINGS

FIG. 1 is a cross-sectional view of a device with charge stored at an interface between two dissimilar insulators;

FIG. 2 is a cross-sectional view of a device in accordance with embodiments of the present invention with charge stored at two interfaces between dissimilar insulators;

FIG. 3 is a cross-sectional view of a device in accordance with embodiments of the present invention with charge stored at interfaces between an insulator of silicon nitride encased by an insulator of silicon dioxide; and FIG. 4 is a cross-sectional view of a device in accordance with embodiments of the present invention with charge stored at interfaces between of silicon nitride encased by an insulator of calcium fluoride.

DETAILED DESCRIPTION

A device 20 for storing embedded charge in accordance with embodiments of the present invention is illustrated in FIG. 2. The device 20 for storing embedded charge includes layers of silicon dioxide ($SiO_2$) 22 and 24 disposed on opposing surfaces of a layer of silicon nitride ($Si_3N_4$) 26, although the device 20 can comprise other numbers and types of layers in other configurations, such as having layers 22 and 24 made of different materials. The present invention utilizes very wide band gap insulating materials in conjunction with medium to low band gap insulating materials to significantly improve embedded charge high temperature trapped charge retention time.

Referring more specifically to FIG. 2, the device 20 has a conductor 27 on the layer of silicon dioxide 22 which is on the layer of silicon nitride 26 which is on the layer of silicon dioxide 24 which is on a substrate 23, although the device 20 for storing embedded charge could have other numbers and types of non-conducting and conducting layers. The layer of silicon nitride 26 comprises a low to medium band gap insulating layer which is adjacent on opposing sides to the layers of silicon dioxide 22 and 24 which are the wide band gap insulating layers. The layer of silicon nitride 26 has a band gap of approximately 5 eV and the layers of silicon dioxide 22 and 24 each have a band gap of approximately 9 eV. Although the layer of silicon nitride 26 is shown as the low to medium band gap layer, other types of low to medium band gap layers can be used, such as a layer of titanium dioxide ($TiO_2$), strontium titanium oxide $SrTiO_3$, zirconium oxide ($ZrO_2$), or barium titanium oxide ($BaTiO_3$). Additionally, although the layers of silicon dioxide 22 and 24 are shown as the wide band gap layers, other types of wide band gap layers can be used, such as layers of calcium fluoride ($CaF_2$), magnesium fluoride ($MgF_2$), lithium fluoride (LiF), or aluminum oxide ($Al_2O_3$).

An interface 28 is formed between the layer of silicon dioxide 22 and the layer of silicon nitride 26 and an interface 30 is formed between the layer of silicon nitride 26 and the layer of silicon dioxide 24. A fixed, static electronic charge 32 on the order of at least $1 \times 10^{10}$ charges/cm$^2$ is stored at each of the interfaces 28 and 30.

With this device 20 for storing embedded fixed, static charge 32, charge loss at elevated temperature environmental conditions for charge trapped at the interfaces 28 and 30 must be either by Fowler—Nordheim conduction through the layers silicon dioxide 22 and 24 or by Frenkle-Poole conduction laterally through the layer of silicon nitride 26. However, because it is difficult for the charge to travel through the layers of silicon dioxide 28 and 30 or laterally through the layer of silicon nitride 26, the embedded fixed, static charge 32 remains at the interfaces 28 and 30 and thus temperature robustness is thereby improved.

Referring to FIG. 3, another device 40(1) for storing embedded, fixed, static charge 41 with improved temperature robustness in accordance with embodiments of the present invention is illustrated. The device 40(1) comprises a layer of silicon nitride 42 which is completely encased in a layer of silicon dioxide 44 with a conductor 45 on one surface 48(1) of the layer of silicon dioxide 44 which is on the suitable substrate 43, such as silicon, although the device 40(1) could comprise other types and numbers of layers in other configurations, such as with or without the conductor 45 and/or the substrate 43 and with other configurations for the conductor 45 and/or substrate 43. The layer of silicon dioxide 44 has outer surfaces 48(1)-48(4), although the layer of silicon dioxide 44 could have other numbers of outer surfaces. The layer of silicon nitride 42 has a band gap of approximately 5 eV and the layer of silicon dioxide 44 has a band gap of approximately 9 eV. Although a layer of silicon dioxide 44 and a layer of silicon nitride 42 are used in this embodiment, again as described with reference to FIG. 2, other types of dissimilar insulating materials with the band gap differences discussed herein can be used.

Interfaces 46(1)-46(4) are formed between the layer of silicon nitride 42 and the layer of silicon dioxide 44. A fixed, static electronic charge 50 on the order of at least $1 \times 10^{10}$ charges/cm$^2$ is stored at each of the interfaces 46(1) and 46(3), although the charge could be stored at other interfaces, such as interfaces 46(2) and 46(4), in other configurations. Again, the charge retention and temperature robustness of the device 40(1) is further enhanced because the layer of silicon dioxide 44 surrounds all of the outer surfaces of the layer of silicon nitride 42.

Referring to FIG. 4, another device 40(2) for storing embedded fixed, static charge 52 with improved temperature robustness in accordance with embodiments of the present invention is illustrated. Elements in FIG. 4 which are like those shown and described in FIG. 3 will have like reference numerals. The device 40(2) comprises a layer of silicon nitride 42 is completely encased in a layer of calcium fluoride ($CaF_2$) 54 with a conductor 55 on one surface 58(1) of the layer of calcium fluoride 54 and a suitable substrate 53 on another surface 58(3) of the layer of calcium fluoride 54, such as silicon, although the device 40(2) could comprise other types and numbers of layers in other configurations, such as with or without the conductor 55 and/or the substrate 53 and with other configurations for the conductor 55 and/or substrate 53. The layer of calcium fluoride 54 has outer surfaces 58(1)-58(4), although the layer of calcium fluoride 54 could have other numbers of outer surfaces. The layer of calcium fluoride 54 has a band gap of approximately 12.1 eV and the layer of silicon nitride 42 has a band gap of approximately 5 eV. Therefore, the encasing layer of calcium fluoride 54 provides a very high barrier around the entire outer surface of the layer of silicon nitride 42 that must be overcome before any trapped charge 52 at the interfaces 56(1) and 56(3) between the layer of calcium fluoride 54 and the layer of silicon nitride 42 is lost. Although a layer of calcium fluoride 54 and a layer of silicon nitride 42 are used in this embodiment, again as described with reference to FIG. 2, other types of dissimilar insulating materials with the band gap differences discussed herein can be used.

Interfaces 56(1)-56(4) are formed between the layer of silicon nitride 42 and the encasing layer of calcium fluoride 54. A fixed, static electronic charge 52 on the order of at least $1 \times 10^{10}$ charges/cm$^2$ is stored at each of the interfaces 56(1) and 56(3), although the charge could be stored at other interfaces, such as interfaces 56(2) and 56(4) in other configurations. Again, the charge retention and temperature robustness of the device 40(2) is further enhanced because the layer of calcium fluoride 54 surrounds all of the outer surfaces of the layer of silicon nitride 42.

Accordingly, a device for storing embedded charge in accordance with the present invention is a composite structure of dissimilar insulating materials or insulators that has a wide band gap insulating material encasing at least a portion of a lower band gap material. In these embodiments, the wide band gap insulating material should have a band gap of over about 6.0 eV and the low to medium band gap material should have a band gap of about 5.5 eV or less. Additionally, the selection of the dissimilar insulating materials for each of the layers may be based at least partially on the relative permittivity of each of the dissimilar insulating materials. In these embodiments, the permittivity of the wide band gap material could be lower than the permittivity of the low to medium band gap material to assist with charge retention.

Referring to FIG. 2, a method for making the device 20 for storing embedded charge 32 in accordance with embodiments of the present invention will now be described. On a suitable substrate a layer of wide band gap insulating material comprising silicon dioxide 24, a layer of low to medium band gap material comprising silicon nitride 26 is deposited by Chemical Vapor Deposition (CVD), although other techniques for depositing layer 26 can be used, such as sputtering, evaporation, atomic layer epitaxy, and molecular beam epitaxy. Next, another layer of wide band gap insulating material comprising silicon dioxide 22 is deposited on the layer silicon nitride 26 by Chemical Vapor Deposition (CVD), although other techniques for depositing layer 22 can be used, such as sputtering, evaporation, atomic layer epitaxy, and molecular beam epitaxy. Next, a fixed, static electronic charge 32 on the order of at least $1 \times 10^{10}$ charges/cm$^2$ is injected by high field injection into the device 20 and is trapped at the interfaces 28 and 30, although other techniques for embedding the charge 32, such as ballistic injection, can be used.

Referring to FIG. 3, a method for making the device 40(1) for storing embedded charge 41 in accordance with embodiments of the present invention will now be described. A layer of silicon dioxide 44 is deposited by Chemical Vapor Deposition (CVD) on a suitable substrate 43, such as silicon although other materials could be used for the substrate 43 and the layer 44 could be formed in other manners. A layer of low to medium band gap material comprising silicon nitride 42 is deposited on the layer of silicon dioxide 44 by CVD and is patterned to the shape shown, although other techniques for forming layer 42 can be used, such as sputtering, evaporation, atomic layer epitaxy, and molecular beam epitaxy or depositing the silicon nitride 42 in a trench in the layer of silicon dioxide 44. Next, more of the wide band gap insulating material comprising silicon dioxide 44 is deposited to encase the layer of silicon nitride 42. Once the layer of silicon nitride 42 is encased, a fixed, static electronic charge 41 on the order of at least $1\times10^{10}$ charges/cm$^2$ is injected by high field injection into the device 40(1) and is trapped at the interfaces 46(1) and 46(3), although other techniques for embedding the charge 41, such as ballistic injection, can be used.

Referring to FIG. 4, a method for making the device 40(2) for storing embedded charge 52 in accordance with embodiments of the present invention will now be described. A layer of calcium fluoride 54 is deposited by sputtering on a suitable substrate 53, such as silicon although other materials could be used for the substrate 53 and the layer 54 could be formed in other manners. A layer of low to medium band gap material comprising silicon nitride 42 is deposited on the layer of calcium fluoride 54 and by CVD and is patterned to the shape shown, although other techniques for forming layer 42 can be used, such as sputtering, evaporation, atomic layer epitaxy, and molecular beam epitaxy or depositing the silicon nitride 42 in a trench in the layer of calcium fluoride 54. Next, more of the wide band gap insulating material comprising calcium fluoride is deposited to encase the layer of silicon nitride 42. Next, a fixed, static electronic charge 52 on the order of at least $1\times10^{10}$ charges/cm$^2$ is injected by high field injection into the device 40(2) and is trapped at the interfaces 56(1) and 56(3), although other techniques for embedding the charge 52, such as ballistic injection, can be used.

Accordingly, the present invention provides a system and method for making local regions of embedded electronic charge with high temperature reliability. The present invention utilizes very wide band gap insulating materials in conjunction with medium to low band gap insulating materials to significantly improve embedded charge high temperature trapped charge retention time. The present invention is also easily integratable with standard integrated circuits and silicon carbide devices.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A device for storing embedded charge comprising:
a first insulator having at least two outer surfaces, the first insulator having a band gap of less than about 5.5 eV; and
at least one second insulator on at least each of the at least two outer surfaces of the first insulator to form at least one interface between the first and second insulators and has a band gap of more than about 6.0 eV; and
injected, fixed, static electronic charge in addition to inherent formation charge stored at the at least one interface, wherein the injected, fixed, static electronic charge at the at least one interface between the first and second insulators is negative, fixed static electronic charge and further consisting of no more than one continuous conductor structure on the second; insulator.

2. The device as set forth in claim 1 wherein the first insulator is selected from a group consisting of $Si_3N_4$, $TiO_2$, $SrTiO_3$, $ZrO_2$, and $BaTiO_3$ and the second insulator is selected from a group consisting of $SiO_2$, $CaF_2$, $MgF_2$, LiF, and $Al_2O_3$.

3. The device as set forth in claim 1 wherein the second insulator comprises at least two layers, each of the layers of the second insulator are on a different one of the outer surfaces of the first insulator.

4. The device as set forth in claim 1 wherein the second insulator against one of one or more surfaces of the first insulator is the same as the second insulator against all other surfaces of the first insulator and substantially encases the first insulator.

5. The device as set forth in claim 1 wherein the band gap of the second insulator is at least double the band gap of the first insulator.

6. The device as set forth in claim 1 wherein a permittivity of the second insulator is lower than a permittivity of the first insulator.

7. The device as set forth in claim 5 wherein the second insulator comprises a non-oxide insulating layer.

8. The device as set forth in claim 7 wherein the non-oxide insulating layer is selected from a group consisting of $CaF_2$ $MgF_2$, and LiF.

9. The device as set forth in claim 1 wherein the injected, fixed, static, electronic charge further comprises at least one of high field injected and ballistic injected, fixed, static, electronic charge on the order of at least $1\times10^{10}$ charges/cm$^2$ stored at the at least one interface.

\* \* \* \* \*